United States Patent
Weiss et al.

(10) Patent No.: US 10,996,264 B2
(45) Date of Patent: May 4, 2021

(54) MEASUREMENT METHOD AND DEVICE WITH COMPENSATION FOR A SHIFTING FREQUENCY

(71) Applicant: Rohde & Schwarz GmbH & Co. KG, Munich (DE)

(72) Inventors: Walter Weiss, Poing (DE); Jan-Patrick Schultheis, Kirchheim (DE)

(73) Assignee: ROHDE & SCHWARZ GMBH & CO. KG, Munich (DE)

( * ) Notice: Subject to any disclaimer, the term of this patent is extended or adjusted under 35 U.S.C. 154(b) by 10 days.

(21) Appl. No.: 16/208,014

(22) Filed: Dec. 3, 2018

(65) Prior Publication Data
US 2020/0174061 A1 Jun. 4, 2020

(51) Int. Cl.
*G01R 23/00* (2006.01)
*G01R 31/28* (2006.01)
*G01R 27/28* (2006.01)

(52) U.S. Cl.
CPC ......... *G01R 31/2824* (2013.01); *G01R 27/28* (2013.01)

(58) Field of Classification Search
CPC .......................... G01R 31/2824; G01R 27/28
USPC ......................................................... 331/44
See application file for complete search history.

(56) References Cited

U.S. PATENT DOCUMENTS

| 7,868,607 | B2 | 1/2011 | Dunsmore et al. | |
| 8,862,084 | B2 * | 10/2014 | Carlsson | H04B 17/29 455/226.1 |
| 2009/0216468 | A1 | 8/2009 | Anderson | |
| 2011/0288820 | A1 * | 11/2011 | Bednorz | H04B 3/462 702/176 |
| 2015/0177300 | A1 * | 6/2015 | Paech | G01R 27/32 702/66 |

FOREIGN PATENT DOCUMENTS

| DE | 10 2005 030 221 A1 | 3/2006 |
| DE | 11 2005 000 430 T5 | 12/2006 |

* cited by examiner

*Primary Examiner* — Richard Tan
(74) *Attorney, Agent, or Firm* — Ditthavong, Steiner & Mlotkowski

(57) ABSTRACT

A measurement method and a measurement device for performing a measurement with respect to a frequency-converting device under test and compensating for a shifting frequency are provided. The measurement method comprises the steps of applying an input signal to an input of the device under test, receiving an output signal from an output of the device under test, converting the output signal into a digitized signal comprising digital samples, estimating a received frequency with respect to the output signal on the basis of the digital samples, and comparing the received frequency to an expected frequency.

16 Claims, 3 Drawing Sheets

MEASUREMENT METHOD AND DEVICE WITH COMPENSATION FOR A SHIFTING FREQUENCY

TECHNICAL FIELD

The invention relates to a measurement method and a measurement device for performing a measurement with respect to a frequency-converting device under test and compensating for a shifting frequency.

BACKGROUND ART

Generally, in times of an increasing number of applications employing a plurality of electrical circuits, especially frequency-converting circuitry typically comprising a local oscillator, there is a growing need of a measurement method and a measurement device especially for verifying correct functioning of said applications in a highly efficient and accurate manner, thereby especially taking into consideration that the frequency of the local oscillator is not entirely stable.

US 2009/0216468 A1 discloses a multimode network analyzer (VNA) and the method of using the same. The VNA includes a signal input port that receives a test signal from a device under test, an LO signal generator, a mixer, an IF filter and a processor. The LO signal generator generates a mixer LO signal from a mixer input test signal, the LO signal generator having first and second modes. The mixer LO signal is substantially a first periodic signal in the first mode and a second periodic signal having a plurality of harmonically related tones in the second mode. The mode that is currently operative is determined by a mixer control signal. The mixer is driven by the LO signal and has an output that is filtered by the IF filter to generate an IF signal. The processor analyzes the IF signal to determine a parameter characterizing the test signal and outputs that parameter. As it can be seen, due to the lack of a shifting frequency compensation, both said multimode network analyzer and the corresponding method can disadvantageously not ensure an efficient and accurate measurement.

Accordingly, there is a need to provide a measurement method and a measurement device for performing a measurement with respect to a frequency-converting device under test and compensating for a shifting frequency, whereby said measurement can be performed in a highly efficient and accurate manner.

SUMMARY OF THE INVENTION

According to a first aspect of the invention, a measurement method for performing a measurement with respect to a frequency-converting device under test and compensating for a shifting frequency is provided. The measurement method comprises the steps of applying an input signal to an input of the device under test, receiving an output signal from an output of the device under test, converting the output signal into a digitized signal comprising digital samples, estimating a received frequency with respect to the output signal on the basis of the digital samples, and comparing the received frequency to an expected frequency. Advantageously, in this manner, measurements can be performed in a highly accurate and efficient manner.

According to a first implementation form of the first aspect of the invention, the input signal applied to the input of the device under test comprises a radio frequency signal, preferably a radio frequency input signal, more preferably a radio frequency test input signal, most preferably a predefined radio frequency test input signal. Advantageously, said input signal may preferably be generated with the aid of a signal generator.

According to a second implementation form of the first aspect of the invention, the output signal received from the output of the device under test comprises an intermediate frequency signal, preferably an intermediate frequency output signal, more preferably an intermediate frequency measurement signal, most preferably an intermediate frequency device under test output signal. Advantageously, the output signal may especially be reduced in frequency with respect to the input signal.

According to a further implementation form of the first aspect of the invention, the received frequency comprises an intermediate frequency, preferably a received intermediate frequency. Advantageously, the received frequency may preferably be lower than an input frequency of the input signal.

According to a further implementation form of the first aspect of the invention, the expected frequency comprises an intermediate frequency, preferably an expected intermediate frequency, more preferably a predefined frequency, most preferably a predefined intermediate frequency. Advantageously, the expected frequency may preferably be predefined by the specification of the device under test.

According to a further implementation form of the first aspect of the invention, the measurement method further comprises the step of mixing the digitized signal with a mixing signal. Advantageously, the respective signal frequency may preferably be reduced, which leads to a higher measurement efficiency due to a reduced complexity.

According to a further implementation form of the first aspect of the invention, the measurement method further comprises the step of providing a mixed signal resulting from mixing the digitized signal with the mixing signal for a filter, preferably a band pass filter, more preferably a narrow band filter. Advantageously, the respective signal may preferably be cleaned with respect to unwanted signal portions and/or noise.

According to a further implementation form of the first aspect of the invention, the mixing signal comprises a predefined signal, preferably an oscillator signal, more preferably a numerically controlled oscillator signal, most preferably a predefined numerically controlled oscillator signal. Advantageously, complexity can further be reduced, thereby increasing measurement efficiency.

According to a further implementation form of the first aspect of the invention, a mixing frequency of the mixing signal comprises a sum frequency of an oscillator frequency, preferably a numerically controlled oscillator frequency, and a certain frequency difference. In addition to this or as an alternative, the measurement method further comprises the step of adjusting the mixing frequency such that a mixed frequency of the mixed signal is within a frequency range of the filter, preferably the band pass filter, more preferably the narrow band filter. Advantageously, the mixed signal can be cleaned with the filter without losing the signal during filtering.

According to a further implementation form of the first aspect of the invention, the measurement method further comprises the step of frequency shifting the output signal before converting the output signal into the digitized signal. Advantageously, for converting the output signal into the digitized signal, a lower-performance analog to digital converter can be used, which leads to reduced costs, thereby increasing measurement efficiency.

According to a further implementation form of the first aspect of the invention, the estimation of the received frequency with respect to the output signal is done on the basis of the same digital samples as the respective measurement. Advantageously, performing solely one measurement is sufficient for acquiring both characterizing parameters with respect to the output signal and compensation parameters for compensating for a shifting frequency, which leads to an increased measurement efficiency. Additionally, it is noted that the measurement with respect to the frequency-converting device under test may be performed while compensating for a shifting frequency preferably in a simultaneous manner.

According to a further implementation form of the first aspect of the invention, the measurement method further comprises the step of running a measurement with an adjustment at the same input frequency of the input signal with respect to the digital samples. As an alternative to this, the measurement method further comprises the step of running a measurement with an adjustment at the same input frequency of the input signal with respect to the digital samples on the basis of other digital samples originating from another measurement. Advantageously, for instance, measurement accuracy can further be increased.

According to second aspect of the invention, a measurement device for performing a measurement with respect to a frequency-converting device under test and compensating for a shifting frequency is provided. The measurement device comprises a signal receiver configured to receive an output signal from an output of the device under test, an analog to digital converter configured to convert the output signal into a digitized signal comprising digital samples, an estimator configured to estimate a received frequency with respect to the output signal on the basis of the digital samples, and a comparator configured to compare the received frequency to an expected frequency. Advantageously, in this manner, measurements can be performed in a highly accurate and efficient manner.

According to a first implementation form of the second aspect of the invention, the output signal received from the output of the device under test comprises an intermediate frequency signal, preferably an intermediate frequency output signal, more preferably an intermediate frequency measurement signal, most preferably an intermediate frequency device under test output signal. In addition to this or as an alternative, the received frequency comprises an intermediate frequency, preferably a received intermediate frequency. Further additionally or further alternatively, the expected frequency comprises an intermediate frequency, preferably an expected intermediate frequency, more preferably a predefined frequency, most preferably a predefined intermediate frequency. Advantageously, the expected frequency may preferably be predefined by the specification of the device under test.

According to a second implementation form of the second aspect of the invention, the measurement device further comprises a mixer configured to mix the digitized signal with a mixing signal. Advantageously, the respective signal frequency may preferably be reduced, which leads to a higher measurement efficiency due to a reduced complexity.

According to a further implementation form of the second aspect of the invention, the measurement device further comprises a filter, preferably a band pass filter, more preferably a narrow band filter, for which a mixed signal resulting from mixing the digitized signal with the mixing signal is provided. Advantageously, the respective signal may preferably be cleaned with respect to unwanted signal portions and/or noise.

According to a further implementation form of the second aspect of the invention, the mixing signal comprises a predefined signal, preferably an oscillator signal, more preferably a numerically controlled oscillator signal, most preferably a predefined numerically controlled oscillator signal. Advantageously, complexity can further be reduced, thereby increasing measurement efficiency.

According to a further implementation form of the second aspect of the invention, a mixing frequency of the mixing signal comprises a sum frequency of an oscillator frequency, preferably a numerically controlled oscillator frequency, and a certain frequency difference. In addition to this or as an alternative, the measurement device further comprises an adjuster configured to adjust the mixing frequency such that a mixed frequency of the mixed signal is within a frequency range of the filter, preferably the band pass filter, more preferably the narrow band filter. Advantageously, the mixed signal can be cleaned with the filter without losing the signal during filtering.

According to a further implementation form of the second aspect of the invention, the measurement device further comprises an additional mixer, preferably an analog mixer, configured to frequency shift the output signal before the output signal is converted into the digitized signal. Advantageously, for converting the output signal into the digitized signal, a lower-performance analog to digital converter can be used, which leads to reduced costs, thereby increasing measurement efficiency.

According to a further implementation form of the second aspect of the invention, the estimator performs the estimation of the received frequency with respect to the output signal on the basis of the same digital samples as the respective measurement. Advantageously, performing solely one measurement is sufficient for acquiring both characterizing parameters with respect to the output signal and compensation parameters for compensating for a shifting frequency, which leads to an increased measurement efficiency. Additionally, it is noted the measurement with respect to the frequency-converting device under test may be performed while compensating for a shifting frequency preferably in a simultaneous manner.

BRIEF DESCRIPTION OF THE DRAWINGS

Exemplary embodiments of the invention are now further explained with respect to the drawings by way of example only, and not for limitation. In the drawings.

DETAILED DESCRIPTION OF THE PREFERRED EMBODIMENTS

Figure 1:
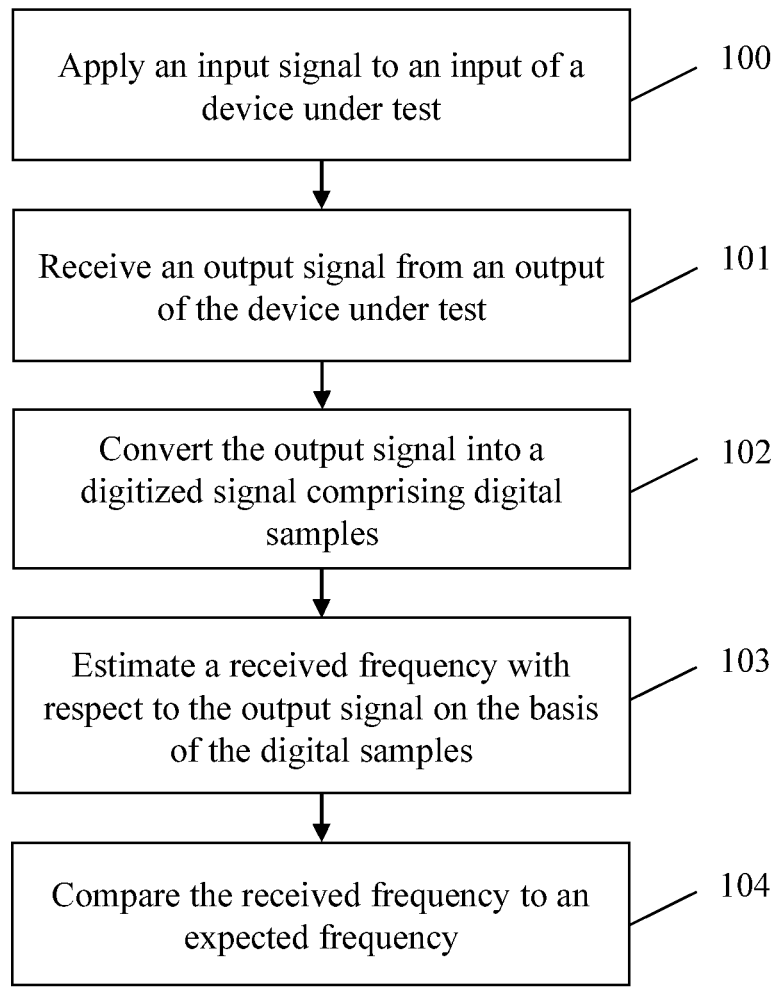
FIG. 1 shows a flow chart of an exemplary embodiment of the first aspect of the invention.

Firstly, FIG. 1 shows a flow chart of an exemplary embodiment of the inventive measurement method for performing a measurement with respect to a frequency-converting device under test and compensating for a shifting frequency. In a first step 100, an input signal is applied to an input of the device under test. Then, in a second step 101, an output signal is received from an output of the device under test. Furthermore, in a third step 102, the output signal is converted into a digitized signal comprising digital samples. Additionally, in a fourth step 103, a received frequency with respect to the output signal is estimated on the basis of the digital samples. Moreover, in a fifth step 104, the received frequency is compared to an expected frequency.

In this context, it is noted that the input signal applied to the input of the device under test may especially comprise a radio frequency signal, preferably a radio frequency input signal, more preferably a radio frequency test input signal, most preferably a predefined radio frequency test input signal.

In addition to this, the output signal received from the output of the device under test may especially comprise an intermediate frequency signal, preferably an intermediate frequency output signal, more preferably an intermediate frequency measurement signal, most preferably an intermediate frequency device under test output signal.

It should further be mentioned that the received frequency may especially comprise an intermediate frequency, preferably a received intermediate frequency.

With respect to the expected frequency, it is noted that the expected frequency may especially comprise an intermediate frequency, preferably an expected intermediate frequency, more preferably a predefined frequency, most preferably a predefined intermediate frequency. Additionally or alternatively, the expected frequency may especially be predefined on the basis of a specification of the device under test and/or on the basis of at least one foregoing measurement with respect to the device under test.

It might be particularly advantageous if the measurement method further comprises the step of mixing the digitized signal with a mixing signal.

In this context, the measurement method may further comprise the step of providing a mixed signal resulting from mixing the digitized signal with the mixing signal for a filter, preferably a band pass filter, more preferably a narrow band filter.

With respect to the above-mentioned mixing signal, it is noted that the mixing signal may especially comprise a predefined signal, preferably an oscillator signal, more preferably a numerically controlled oscillator signal, most preferably a predefined numerically controlled oscillator signal.

It is further noted that a mixing frequency of the mixing signal may especially comprise a sum frequency of an oscillator frequency, preferably a numerically controlled oscillator frequency, and a certain frequency difference.

In addition to this or as an alternative, the measurement method may further comprise the step of adjusting the mixing frequency such that a mixed frequency of the mixed signal is within a frequency range of the filter, preferably the band pass filter, more preferably the narrow band filter.

Moreover, it might be particularly advantageous if the measurement method further comprises the step of frequency shifting the output signal before converting the output signal into the digitized signal.

Furthermore, the estimation of the received frequency with respect to the output signal may preferably be done on the basis of the same digital samples as the respective measurement.

It is further noted that the measurement method may further comprise the step of running a measurement with an adjustment at the same input frequency of the input signal with respect to the digital samples.

As an alternative to this, the measurement method may further comprise the step of running a measurement with an adjustment at the same input frequency of the input signal with respect to the digital samples on the basis of other digital samples originating from another measurement.

Figure 2:
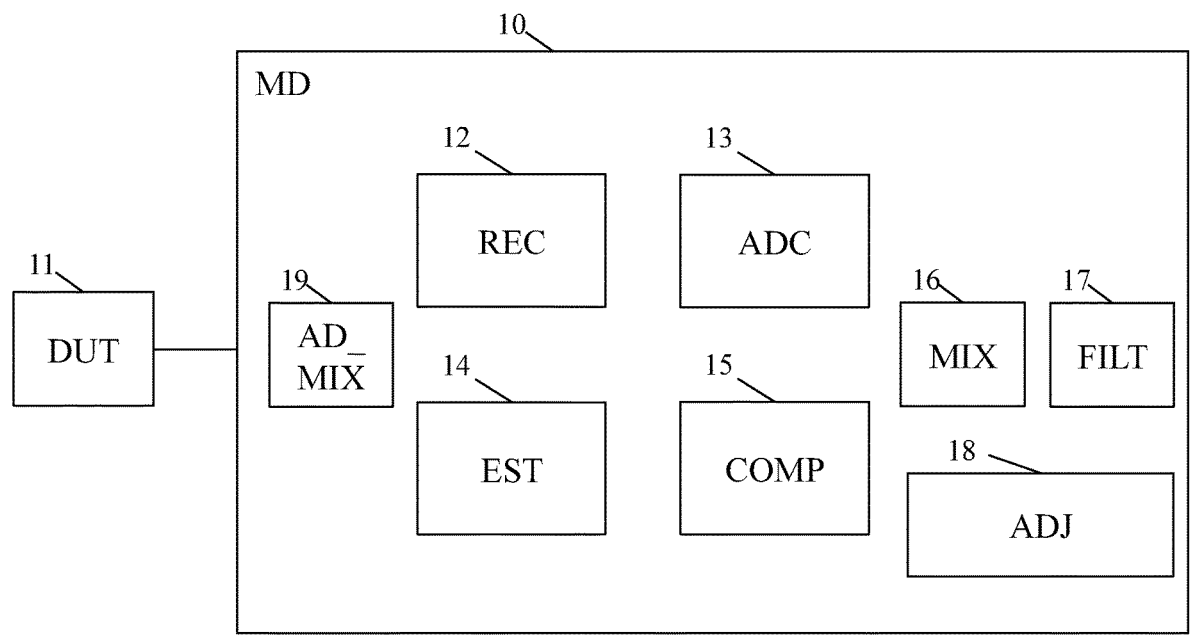
FIG. 2 shows an exemplary embodiment of the second aspect of the invention.

Now, with respect to FIG. 2, a first exemplary embodiment of the inventive measurement device 10 for performing a measurement with respect to a frequency-converting device under test 11 and compensating for a shifting frequency is described. Said measurement device 10 comprises a signal receiver 12, an analog to digital converter 13, an estimator 14, a comparator 15, a mixer 16, a filter 17, an adjuster 18, and an additional mixer 19.

In this context, the signal receiver 12 receives an output signal from an output of the device under test 11. The analog to digital converter 13 converts the output signal into a digitized signal comprising digital samples. Furthermore, the estimator 14 estimates a received frequency with respect to the output signal on the basis of the digital samples. In addition to this, the comparator 15 compares the received frequency to an expected frequency.

With respect to the output signal received from the output of the device under test 11, it is noted that said output signal may especially comprise an intermediate frequency signal, preferably an intermediate frequency output signal, more preferably an intermediate frequency measurement signal, most preferably an intermediate frequency device under test output signal.

In addition to this or as an alternative, the received frequency may especially comprises an intermediate frequency, preferably a received intermediate frequency.

Further additionally or further alternatively, it is noted that the expected frequency may especially comprise an intermediate frequency, preferably an expected intermediate frequency, more preferably a predefined frequency, most preferably a predefined intermediate frequency.

Moreover, with respect to the mixer 16, it should be mentioned that the mixer 16 mixes the digitized signal with a mixing signal.

With respect to the filter 17, it is noted that it might be particularly advantageous if the filter 17 may especially be a low pass filter, preferably a band pass filter, more preferably a narrow band filter. In addition to this, a mixed signal resulting from mixing the digitized signal with the mixing signal with the aid of the mixer 16 is provided for the filter 17.

Furthermore, the above-mentioned mixing signal may especially comprise a predefined signal, preferably an oscillator signal, more preferably a numerically controlled oscillator signal, most preferably a predefined numerically controlled oscillator signal.

In addition to this, it is noted that a mixing frequency of the mixing signal may especially comprise a sum frequency of an oscillator frequency, preferably a numerically controlled oscillator frequency, and a certain frequency difference.

In this context, the adjuster 18 adjusts the mixing frequency such that a mixed frequency of the mixed signal is within a frequency range of the filter 17.

Moreover, with respect to the additional mixer 19, it should be mentioned that the additional mixer 19 may preferably be an analog mixer. Said mixer 19 frequency shifts the output signal before the output signal is converted into the digitized signal.

With respect to the estimator 14, it might be particularly advantageous if the estimator 14 performs the estimation of the received frequency with respect to the output signal on the basis of the same digital samples as the respective measurement.

It is further noted that the estimator 14 and the comparator may preferably be implemented as a processor, preferably a single processor.

In addition to this or as an alternative, the estimator 14, the comparator 15, and the adjuster 18 may preferably be implemented as a processor, preferably a single processor.

Figure 3:
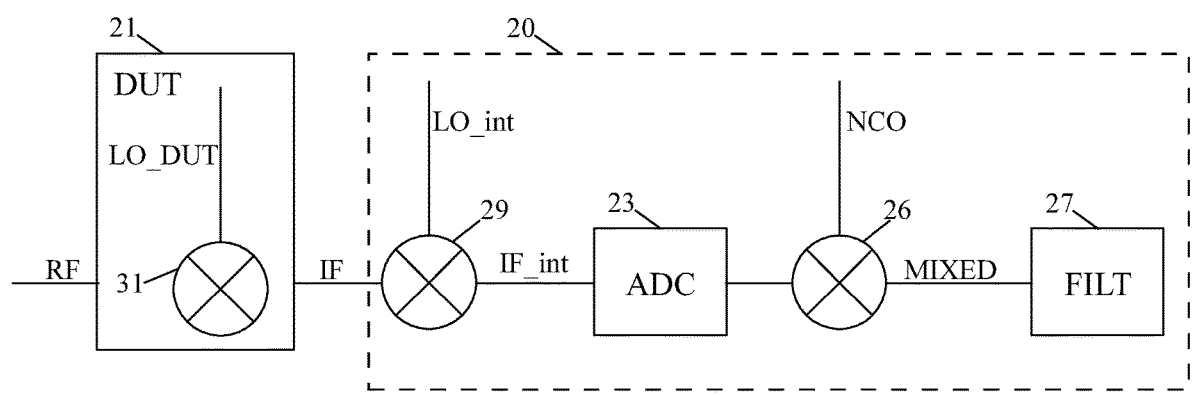
FIG. 3 shows a further exemplary embodiment of the second aspect of the invention.

Furthermore, FIG. 3 depicts a second exemplary embodiment of the inventive measurement device 20 for performing a measurement with respect to a frequency-converting device under test 21 and compensating for a shifting frequency.

As it can be seen from FIG. 3, the device under test 21 comprises an embedded mixer 31, which mixes an incoming radio frequency signal comprising a radio frequency RF with an embedded local oscillator signal comprising an embedded local oscillator frequency LO_DUT. The resulting signal is then fed into measurement device 20 especially in the form of an intermediate frequency signal comprising an intermediate frequency IF.

In this context, it is noted that the embedded local oscillator frequency LO_DUT is not entirely stable. Thus, it has a frequency offset, especially a frequency offset being variable with time, compared to the respective value set for the measurement. Especially in the case of a small bandwidth measurement, the measurement device 20 is adapted to compensate said frequency offset and/or to adapt with time especially in order to avoid that the signal to be measured gets out of the filter range of the filter 27, which would lead to a non-measurement of the signal to be measured. Advantageously, said frequency offset compensation can be performed internally by the measurement device 20 especially without the usage of additional devices.

With respect to the radio frequency signal, it should be mentioned that the radio frequency signal may preferably be generated with the aid of a signal generator. In addition to this, it is noted that the measurement device 20 may especially comprise said signal generator.

As it can further be seen from FIG. 3, a first mixer 29 of the measurement device 20 mixes the received intermediate frequency signal with an internal local oscillator signal comprising an internal local oscillator frequency LO_int, which results in an internal intermediate frequency signal comprising an internal intermediate frequency IF_int.

In this exemplary case, the measurement device 20 comprises the first mixer 29. However, the first mixer 29 could alternatively be seen as an additional mixer, preferably an additional analog mixer. As a consequence of this, the first mixer 29 is not necessarily part of the measurement device and could therefore be embodied as a mixer outside the measurement device 20.

Furthermore, the measurement device 20 comprises an analog to digital converter 23, a mixer 26, and a filter 27. The analog to digital converter 23 converts the internal intermediate frequency signal into a respective digitized signal comprising digital samples.

In addition to this, the mixer 26 mixes the digitized signal with a numerically controlled oscillator signal comprising a numerically controlled oscillator frequency NCO, which results in a mixed signal comprising a mixed frequency MIXED. Said mixed signal is provided for the filter 27 comprising a bandwidth BW.

With respect to the radio frequency RF, the embedded local oscillator frequency LO_DUT, the internal local oscillator frequency LO_int, the numerically controlled oscillator frequency NCO, and the mixed frequency, it is noted that the following equation applies:

$$\text{MIXED} = \text{RF} - \text{LO\_DUT} - \text{LO\_int} - \text{NCO}. \quad (1)$$

In this context, the internal local oscillator frequency LO_int and the numerically controlled oscillator frequency NCO are selected to have MIXED=0, preferably to have MIXED=0 with a certain width. Additionally, the frequency for MIXED or the mixed frequency, respectively, has to path the filter 27 with the given bandwidth BW.

Said selection of the internal local oscillator frequency LO_int and the numerically controlled oscillator frequency NCO may especially be accomplished with the aid of a processor preferably according to the processor mentioned with respect to FIG. 2. Additionally, the measurement device may preferably comprise said processor.

In the case that the embedded local oscillator frequency LO_DUT differs from the respective value set for the measurement by a frequency difference D, especially an embedded frequency difference, the following equation applies:

$$\text{MIXED} = \text{RF} - \text{LO\_DUT} - \text{LO\_int} - \text{NCO} + D. \quad (2)$$

In this case, the mixed frequency MIXED is not centered to 0, which leads to the fact that the respective signal might not pass the filter 27 of the bandwidth BW. It is noted that the frequency difference D may preferably be greater than the filter bandwidth BW of the filter 27.

Therefore, the above-mentioned processor especially for selecting the internal local oscillator frequency LO_int and the numerically controlled oscillator frequency NCO may estimate the internal intermediate frequency IF_int, may compute the frequency difference D especially on the basis of the foregoing estimation, and may use the sum NCO+D of the numerically controlled oscillator frequency NCO and the frequency difference D instead of the numerically controlled oscillator frequency NCO with special respect to the numerically controlled oscillator signal. While various embodiments of the present invention have been described above, it should be understood that they have been presented by way of example only, and not limitation.

Numerous changes to the disclosed embodiments can be made in accordance with the disclosure herein without departing from the spirit or scope of the invention. Thus, the breadth and scope of the present invention should not be limited by any of the above described embodiments. Rather, the scope of the invention should be defined in accordance with the following claims and their equivalents.

Although the invention has been illustrated and described with respect to one or more implementations, equivalent alterations and modifications will occur to others skilled in the art upon the reading and understanding of this specification and the annexed drawings. In addition, while a particular feature of the invention may have been disclosed with respect to only one of several implementations, such feature may be combined with one or more other features of the other implementations as may be desired and advantageous for any given or particular application.

What is claimed is:

1. A measurement method for performing a measurement with respect to a frequency-converting device under test, comprising the steps of:

applying an input signal to an input of the device under test, receiving an output signal from an output of the device under test, converting the output signal into a digitized signal comprising digital samples,
estimating a received frequency with respect to the output signal of the device under test on the basis of the digital samples,
comparing the received frequency with respect to the output signal to an expected frequency,
mixing the digitized signal with a mixing signal, and
providing a mixed signal resulting from mixing the digitized signal with the mixing signal for a filter selected from a band pass filter or a narrow band filter.

2. The measurement method according to claim 1,
wherein the input signal applied to the input of the device under test is selected from: a radio frequency signal, a radio frequency input signal, a radio frequency test input signal, or a predefined radio frequency test input signal.

3. The measurement method according to claim 1,
wherein the output signal received from the output of the device under test is selected from: an intermediate frequency signal, an intermediate frequency output signal, an intermediate frequency measurement signal, or an intermediate frequency device under test output signal.

4. The measurement method according to claim 1,
wherein the received frequency with respect to the output signal is selected from an intermediate frequency or a received intermediate frequency.

5. The measurement method according to claim 1,
wherein the expected frequency is selected from: an intermediate frequency, an expected intermediate frequency, a predefined frequency, or a predefined intermediate frequency.

6. The measurement method according to claim 1,
wherein the mixing signal is selected from: a predefined signal, an oscillator signal, a numerically controlled oscillator signal, or a predefined numerically controlled oscillator signal.

7. The measurement method according to claim 1,
wherein a mixing frequency of the mixing signal is selected from a sum frequency of an oscillator frequency, a numerically controlled oscillator frequency, or a certain frequency difference, and/or
adjusting the mixing frequency such that a mixed frequency of the mixed signal is within a frequency range of the band pass filter or the narrow band filter.

8. The measurement method according to claim 1,
further comprising the step of frequency shifting the output signal before converting the output signal into the digitized signal.

9. The measurement method according to claim 1, wherein the estimation of the received frequency with respect the output signal is done on the basis of the same digital samples as the respective measurement.

10. The measurement method according to claim 1,
further comprising the step of running a measurement with an adjustment at the same input frequency of the input signal with respect to the digital samples, or
further comprising the step of running a measurement with an adjustment at the same input frequency of the input signal with respect to the digital samples on the basis of other digital samples originating from another measurement.

11. A measurement device for performing a measurement with respect to a frequency-converting device under test, comprising:
a signal receiver configured to receive an output signal from an output of the device under test,
an analog to digital converter configured to convert the output signal into a digitized signal comprising digital samples,
an estimator configured to estimate a received frequency with respect to the output signal of the device under test on the basis of the digital samples,
a comparator configured to compare the received frequency with respect to the output signal to an expected frequency,
a mixer configured to mix the digitized signal with a mixing signal, and
a filter selected from a band pass filter or a narrow band filter, for which a mixed signal resulting from mixing the digitized signal with the mixing signal is provided.

12. The measurement device according to claim 11,
wherein the output signal received from the output of the device under test comprises an intermediate frequency signal, preferably an intermediate frequency output signal, more preferably an intermediate frequency measurement signal, most preferably an intermediate frequency device under test output signal, and/or
wherein the received frequency with respect to the output signal is selected from: an intermediate frequency, or a received intermediate frequency, and/or
wherein the expected frequency is selected from: an intermediate frequency, an expected intermediate frequency, a predefined frequency, or a predefined intermediate frequency.

13. The measurement device according to claim 11,
wherein the mixing signal comprises a predefined signal selected from: an oscillator signal, a numerically controlled oscillator signal, or a predefined numerically controlled oscillator signal.

14. The measurement device according to claim 11,
wherein a mixing frequency of the mixing signal is selected from a sum frequency of an oscillator frequency, a numerically controlled oscillator frequency, or a certain frequency difference, and/or
further comprising an adjuster configured to adjust the mixing frequency such that a mixed frequency of the mixed signal is within a frequency range of the band pass filter or the narrow band filter.

15. The measurement device according to claim 11,
further comprising an analog mixer, configured to frequency shift the output signal before the output signal is converted into the digitized signal.

16. The measurement device according to claim 11,
wherein the estimator performs the estimation of the received frequency with respect to the output signal on the basis of the same digital samples as the respective measurement.

* * * * *